(12) United States Patent
Cheon et al.

(10) Patent No.: US 11,372,031 B2
(45) Date of Patent: Jun. 28, 2022

(54) DEFECT DETECTION IN HIGH VOLTAGE POWER SUPPLY APPARATUS

(71) Applicant: HEWLETT-PACKARD DEVELOPMENT COMPANY, L.P., Spring, TX (US)

(72) Inventors: Kwanghoon Cheon, Suwon-si (KR); Jinyun Park, Hwasung-si (KR); Jonghwa Cho, Suwon-si (KR)

(73) Assignee: HEWLETT-PACKARD DEVELOPMENT COMPANY, L.P., Spring, TX (US)

(*) Notice: Subject to any disclaimer, the term of this patent is extended or adjusted under 35 U.S.C. 154(b) by 0 days.

(21) Appl. No.: 17/274,015

(22) PCT Filed: Sep. 11, 2019

(86) PCT No.: PCT/US2019/050606
§ 371 (c)(1),
(2) Date: Mar. 5, 2021

(87) PCT Pub. No.: WO2020/055997
PCT Pub. Date: Mar. 19, 2020

(65) Prior Publication Data
US 2021/0356498 A1 Nov. 18, 2021

(30) Foreign Application Priority Data
Sep. 11, 2018 (KR) .................. 10-2018-0108430

(51) Int. Cl.
*G03G 15/00* (2006.01)
*G01R 19/165* (2006.01)
(Continued)

(52) U.S. Cl.
CPC ......... *G01R 19/16571* (2013.01); *G01R 1/28* (2013.01); *G01R 31/40* (2013.01); *G03G 15/5004* (2013.01); *H02M 3/33507* (2013.01)

(58) Field of Classification Search
CPC .... G01R 19/16571; G01R 1/28; G01R 31/40; G01R 19/16576; G03G 15/5004; G03G 15/80; H02M 3/33507; H02M 1/00
See application file for complete search history.

(56) References Cited

U.S. PATENT DOCUMENTS 4,516,214 A    5/1985  Ray
2002/0099961 A1  7/2002  Billick et al.
(Continued)

FOREIGN PATENT DOCUMENTS

EP        2541892 B1   12/2016

*Primary Examiner* — G. M. A. Hyder
(74) *Attorney, Agent, or Firm* — Staas & Halsey LLP

(57) ABSTRACT

A high voltage power supply apparatus includes: a comparator, a transformer, a rectifier, and a detector. The comparator is to control output of a basic voltage. A high voltage based on the basic voltage is used to perform an image forming job in an image forming apparatus. The transformer is to output an alternating current voltage of a second side of the transformer by amplifying an alternating current voltage of a first side of the transformer, the amplifying being based on a resonance phenomenon induced from the basic voltage. The rectifier is to output the high voltage by rectifying the alternating current voltage of the second side. The detector is to sense a voltage applied to the comparator and a voltage applied to the transformer, and is to output operational state information of the high voltage power supply apparatus based on the sensed voltages.

15 Claims, 10 Drawing Sheets

(51) Int. Cl.
  *G01R 1/28* (2006.01)
  *G01R 31/40* (2020.01)
  *H02M 3/335* (2006.01)

(56) References Cited

U.S. PATENT DOCUMENTS

| | | | |
|---|---|---|---|
| 2007/0071478 A1* | 3/2007 | Hong | G03G 15/80 |
| | | | 399/88 |
| 2009/0060535 A1 | 3/2009 | Hamaya | |
| 2012/0027447 A1 | 2/2012 | Mukaibara | |
| 2012/0236614 A1 | 9/2012 | Kamata | |
| 2016/0187802 A1 | 6/2016 | Kagawa | |
| 2018/0095403 A1 | 4/2018 | Arimoto et al. | |

* cited by examiner

DEFECT DETECTION IN HIGH VOLTAGE POWER SUPPLY APPARATUS

CROSS REFERENCE TO RELATED APPLICATIONS

This application is filed under 35 U.S.C. § 371 as a National Stage of PCT International Application No. PCT/US2019/050606, filed on Sep. 11, 2019, in the U.S. Patent and Trademark Office, which claims the priority benefit of Korean Patent Application No. 10-2018-0108430 filed on Sep. 11, 2018, in the Korean Patent Office. The disclosures of PCT International Application No. PCT/US2019/050606 and Korean Patent Application No. 10-2018-0108430 are incorporated by reference herein in their entireties.

BACKGROUND

An image forming apparatus applies a high voltage to a developing device in the imaging forming apparatus in order to form an image. The high voltage is generated by a high voltage power supply apparatus in the image forming apparatus.

Meanwhile, a voltage may be measured by using expensive equipment, such as a high voltage probe or a digital voltmeter in the high voltage power supply apparatus in the image forming apparatus.

DETAILED DESCRIPTION

An "image forming apparatus" may include all types of apparatuses capable of performing an image forming job, such as a printer, a scanner, a fax machine, a multi-function printer (MFP), a display apparatus, or the like. Also, "print data" may refer to data converted into a format printable via a printer. Also, a "scan file" may refer to a file generated by scanning an image by a scanner.

Hereinafter, examples of the present disclosure will be described for one of ordinary skill in the art to execute the examples. However, the disclosure may be realized through various different examples and is not limited to the examples described in this specification.

Figure 1:
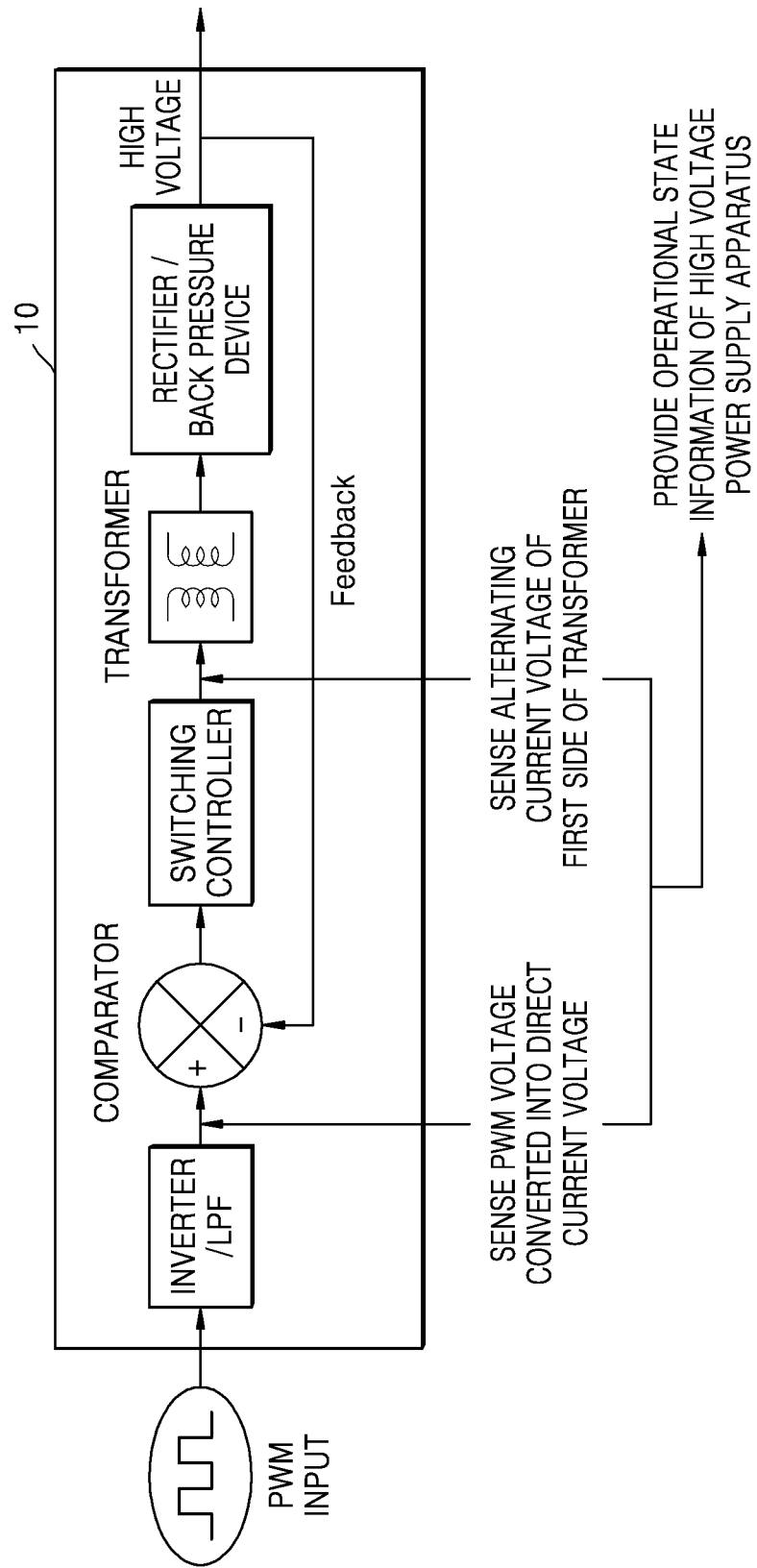
FIG. 1 is a conceptual diagram for describing an operation of a high voltage power supply apparatus, according to an example.

FIG. 1 is a conceptual diagram for describing an operation of a high voltage power supply apparatus 10, according to an example.

Referring to FIG. 1, the high voltage power supply apparatus 10 may generate a high voltage which is used to perform an image forming job in an image forming apparatus. The high voltage power supply apparatus 10 may supply the high voltage to a developing device in the image forming apparatus.

The high voltage power supply apparatus 10 may sense a voltage applied to a comparator and a voltage applied to a transformer in the high voltage power supply apparatus 10 and may provide an operational state of the high voltage power supply apparatus 10 based on a result of the sensing operation.

A first alternating current voltage may be applied to an input terminal of the high voltage power supply apparatus 10, based on a pulse width modulation (PWM) control operation. The first alternating current voltage may be converted into an opposite phase via an inverter and may be converted into a first direct current voltage by passing through a low pass filter (LPF).

Here, the first direct current voltage may be applied to a positive (+) terminal of the comparator of the high voltage power supply apparatus 10. Also, a feedback voltage fed back from the high voltage may be applied to the positive (+) terminal of the comparator. Meanwhile, a reference voltage may be applied to a negative (−) terminal of the comparator. The comparator may, based on a difference between a voltage of the positive (+) terminal of the comparator and a voltage of the negative (−) terminal of the comparator, output a basic voltage on which the high voltage is based.

When the first direct current voltage is not applied to the positive (+) terminal of the comparator, the high voltage power supply apparatus 10 may not operate normally. Thus, the high voltage power supply apparatus 10 may sense a PWM voltage converted into a direct current voltage and identify whether the first alternating current voltage applied to the input terminal is normally applied to the input terminal.

A switching controller may induce a change in a voltage and a current of the transformer, via a resistor, an inductor, and a capacitor (RLC) resonance phenomenon based on the basic voltage. The transformer may output an alternating current voltage of a second side by amplifying an alternating current voltage of a first side.

When a switching operation of the switching controller is not properly performed, the alternating current voltage may not be normally generated by the transformer. When the alternating current voltage of the first side of the transformer is not normally generated, the alternating current voltage of the second side may not be normally generated. Thus, the high voltage power supply apparatus 10 may identify whether the transformer and the switching controller operate normally by sensing the alternating current voltage of the first side of the transformer.

The alternating current voltage of the second side may be converted into a high voltage, which is in the form of a direct current voltage, by passing through a rectifier and a back pressure device. An output terminal of the high voltage power supply apparatus 10 may supply the high voltage to the developing device.

Meanwhile, the high voltage power supply apparatus 10 may sense the PWM voltage converted into the direct current voltage and the alternating current voltage of the first side of the transformer to provide the operational state information of the high voltage power supply apparatus 10. An operation of the high voltage power supply apparatus 10 in detail will be described with reference to FIGS. 2 through 8.

Figure 2:
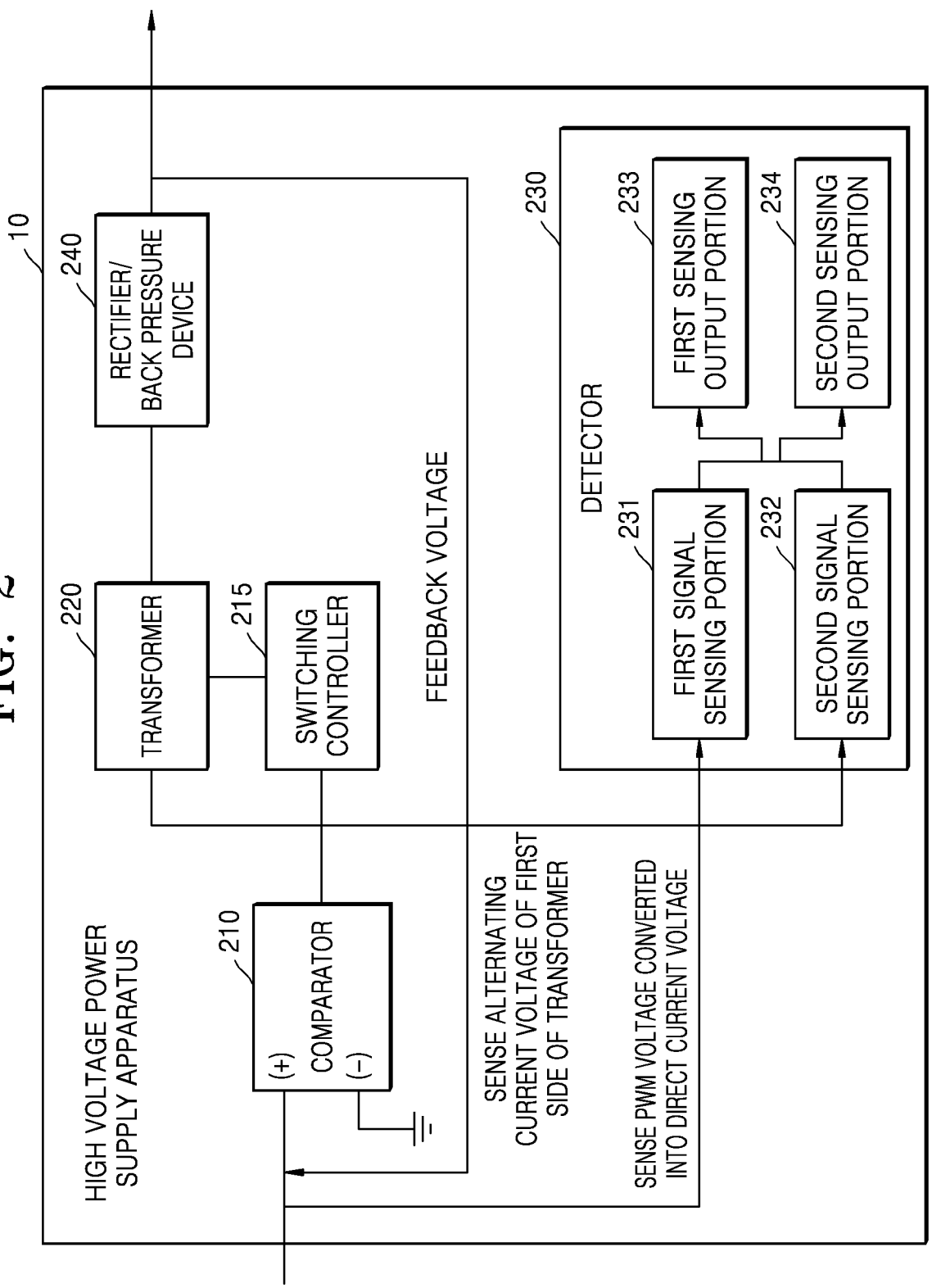
FIG. 2 is a block diagram of components of a high voltage power supply apparatus, according to an example.

FIG. 2 is a block diagram of components of the high voltage power supply apparatus 10, according to an example.

The high voltage power supply apparatus 10 may include a comparator 210, a switching controller 215, a transformer 220, a detector 230, and a rectifier/a back pressure device 240. The high voltage power supply apparatus 10 may be realized by including more or less components than the illustrated components.

The comparator 210 may control an output of a basic voltage on which a high voltage is based, the high voltage being used to perform an image forming job in the image forming apparatus.

A positive (+) terminal of the comparator 210 may receive, from the input terminal, a first direct current voltage which is converted from a first alternating current voltage applied based on a PWM control operation, and a feedback voltage fed back from the high voltage. Also, a negative (−) terminal of the comparator 210 may receive a reference voltage. For example, the comparator 210 may be realized as an OP amplifier (OP-amp).

The comparator 210 may output the basic voltage based on a difference between the voltage input to the positive (+) terminal of the comparator 210 and the voltage input to the negative (−) terminal of the comparator 210.

The switching controller 215 may induce an RLC resonance phenomenon from the basic voltage output from the comparator 210 and induce a change in a voltage and a current of the transformer 220.

The transformer 220 may output an alternating current voltage of a second side by amplifying an alternating current voltage of a first side, based on the RLC resonance phenomenon induced from the basic voltage output from the comparator 210.

The rectifier/the back pressure device 240 may output the high voltage in the form of a direct current voltage, by rectifying the alternating current voltage of the second side.

The detector 230 may sense the voltage applied to the comparator 210 and the voltage applied to the transformer 220 and provide operational state information of the high voltage power supply apparatus 10.

The detector 230 may include a signal sensor configured to sense the voltage applied to the comparator 210 and an alternating current voltage of a first winding wire of the first side of the transformer 220. Also, the detector 230 may include a sensing output portion configured to output, based on a result of the sensing operation of the signal sensor, the operational state information indicating whether the high voltage power supply apparatus 10 operates normally.

The signal sensor may include a first signal sensing portion 231 configured to sense the first direct current voltage input from the input terminal to the positive (+) terminal of the comparator 210 based on the PWM control operation. For example, the first signal sensing portion 231 may include a first transistor. The first transistor may operate when the first direct current voltage is applied to a base of the first transistor.

Also, the signal sensor may include a second signal sensing portion 232 configured to sense the alternating current voltage of the first winding wire of the first side of the transformer 220. For example, the second signal sensing portion 232 may include a second transistor. The second transistor may operate when a direct current voltage of the first winding wire is applied to a base of the second transistor, the direct current voltage of the first winding wire being converted from the alternating current voltage of the first winding wire via a half-wave rectifying circuit.

The sensing output portion may include a first sensing output portion 233 including at least one light-emitting device. For example, when the first transistor and the second transistor operate normally in a state in which the first transistor and the second transistor are connected in series and the sensing output portion is connected to a collector of the first transistor, the first sensing output portion 233 may output a signal notifying that the high voltage power supply apparatus 10 operates normally to the at least one light-emitting device. Here, that the first transistor and the second transistor operate normally may denote that the collector and an emitter of the first transistor are electrically connected to each other and a collector and an emitter of the second transistor are electrically connected to each other. For example, the at least one light-emitting device in the first sensing output portion 233 may be output in a certain color. When the at least one light-emitting device is output in a certain color, a user may identify with the naked eye that the high voltage power supply apparatus 10 operates normally.

The first sensing output portion 233 may be located in the image forming apparatus such that the user may, from the outside, identify the operation of the at least one light-emitting device in the first sensing output portion 233. Even when the first sensing output portion 233 is located in the image forming apparatus, the first sensing output portion 233 may be connected to the outside of the image forming apparatus via an optical guide, and thus, the user may identify with the naked eye that the high voltage power supply apparatus 10 operates normally.

Also, the sensing output portion may include a second sensing output portion 234 configured to transmit the operational state information of the high voltage power supply apparatus 10 to a central processor of the image forming apparatus. For example, when the first transistor and the second transistor operate normally in a state in which the first transistor and the second transistor are connected in series and the sensing output portion is connected to the collector of the first transistor, the second sensing output portion 234 may transmit a signal notifying that the high voltage power supply apparatus 10 operates normally to the central processor of the image forming apparatus. The central processor of the image forming apparatus may display information indicating that the high voltage power supply apparatus 10 operates normally via a user interface in the image forming apparatus. Also, based on the operational state information of the high voltage power supply apparatus 10, the central processor of the image forming apparatus may control an operation of the at least one light-emitting device by changing an output color or an output signal cycle of the at least one light-emitting device in the first sensing output portion 233.

Meanwhile, the switching controller 215 may include a third transistor. The third transistor may repeatedly perform a switching operation, whereby the basic voltage is connected to a base of the third transistor by passing through an auxiliary winding wire of the first side of the transformer 220 so that the first winding wire of the first side is connected to a ground.

Also, the high voltage power supply apparatus 10 may include an output terminal configured to supply the high voltage to the developing device in the image forming apparatus.

Even if expensive equipment, such as a high voltage probe or a digital voltmeter for measuring voltages in the high voltage power supply apparatus 10, is not used, the sensing output portion of the high voltage power supply apparatus 10 displays the operational state information of the high voltage power supply apparatus 10, and thus, the user may identify a state of the high voltage power supply apparatus 10 with the naked eye.

Figure 3:
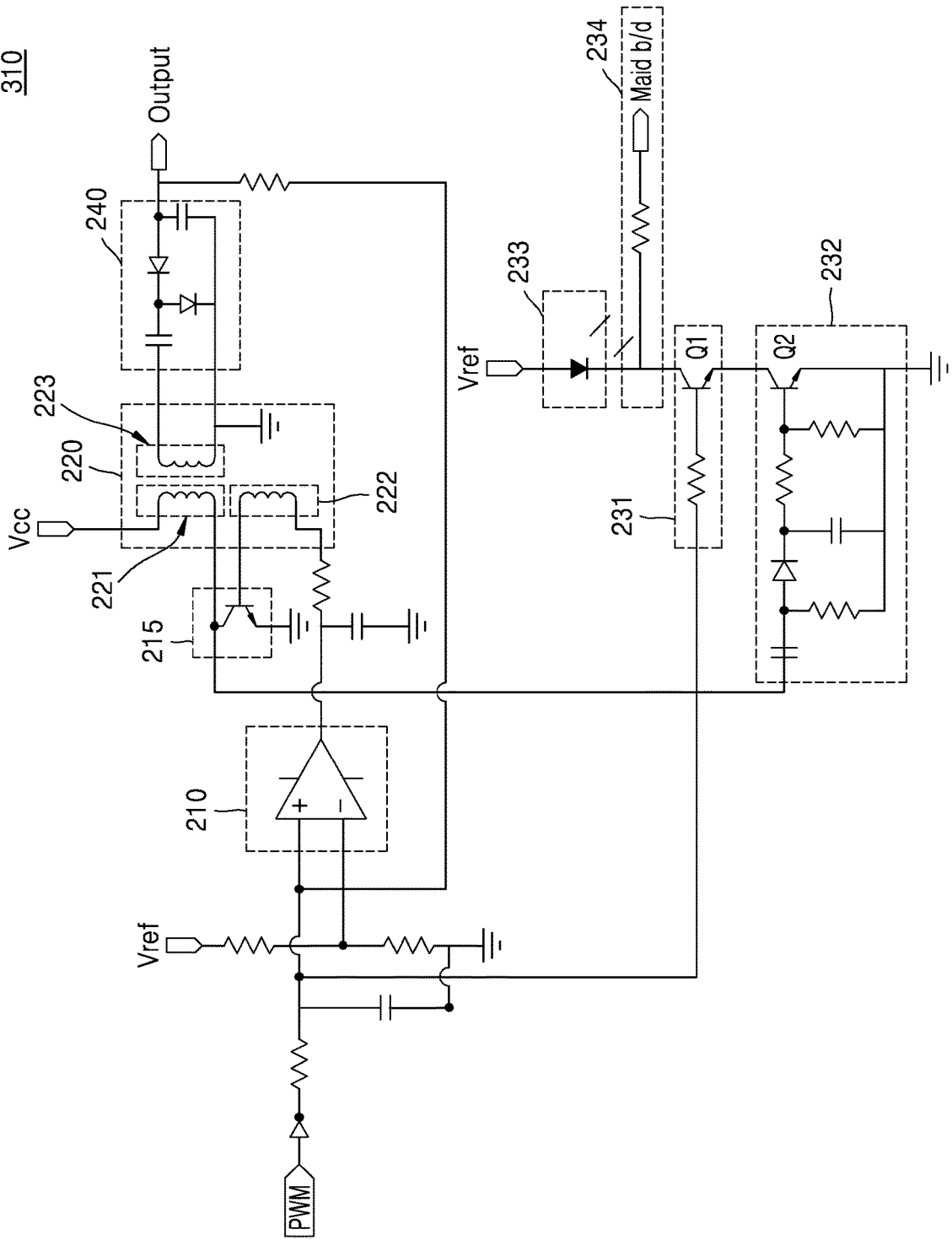
FIG. 3 is a circuit diagram of components of a high voltage power supply apparatus, according to an example.

FIG. 3 is a circuit diagram of components of the high voltage power supply apparatus 10, according to an example.

Referring to a circuit diagram 310 of FIG. 3, the comparator 210 may control an output of a basic voltage on which a high voltage is based, the high voltage being used to perform an image forming job in the image forming apparatus. For example, the comparator 210 may be realized as an OP-amp. Also, the comparator 210 may be realized as other devices than the OP-amp, or may be realized as the OP-amp and other devices.

A positive (+) terminal of the OP-amp may receive a first direct current voltage converted from a first alternating current voltage applied from the input terminal based on a PWM control operation. A process in which the first alternating current voltage is converted into the first direct current voltage will be described with reference to FIG. 4. Also, the positive (+) terminal of the OP-amp may receive a feedback voltage fed back from the high voltage output from the output terminal. Also, a negative (−) terminal of the OP-amp may receive a reference voltage.

The OP-amp may output the basic voltage, based on a difference between a voltage input to the positive (+) terminal of the OP-amp and a voltage input to the negative (−) terminal of the OP-amp. Here, the voltage input to the positive (+) terminal of the OP-amp may be the first direct current voltage and the feedback voltage. The feedback voltage may be a direct current voltage. When the voltage input to the positive (+) terminal of the OP-amp is greater than the reference voltage input to the negative (−) terminal of the OP-amp, the OP-amp may output the basic voltage based on a difference voltage between the voltage input to the positive (+) terminal of the OP-amp and the reference voltage input to the negative (−) terminal of the OP-amp. The OP-amp may control the basic voltage output by the OP-amp by changing the difference voltage.

For example, the OP-amp may adjust the basic voltage output by the OP-amp by adjusting a duty cycle of the PWM control operation. In detail, when the duty cycle of the PWM control operation is adjusted, a level of the direct current voltage input to the positive (+) terminal of the OP-amp by passing through an inverter and an LPF may be adjusted. When the level of the direct current voltage is adjusted, the basic voltage output based on the difference voltage between the voltage input to the positive (+) terminal of the OP-amp and the basic voltage input to the negative (−) terminal of the OP-amp may be adjusted.

The switching controller 215 may induce an RLC resonance phenomenon from the basic voltage output from the comparator 210 and may induce a change in a voltage and a current of the transformer 220. The switching controller 215 may be realized as the third transistor.

The basic voltage output from the OP-amp may control a base current of the third transistor based on the RLC resonance phenomenon. The third transistor may repeatedly perform a switching operation, whereby the basic voltage is connected to the base of the third transistor by passing through an auxiliary winding wire 222 of the first side of the transformer 220 so that the first winding wire 221 of the first side is connected to the ground.

For example, based on the base current of the third transistor, a first switching operation, whereby connection from a collector to the base of the third transistor is changed to connection from the collector to an emitter of the third transistor, and a second switching operation, whereby connection from the collector to the emitter of the third transistor is changed to connection from the collector to the base of the third transistor, may be repeatedly performed.

When the first switching operation and the second switching operation are repeatedly performed, the voltage and the current of the first winding wire 221 of the first side of the transformer 220 may be changed. According to a change in the voltage and the current of the first winding wire 221 of the first side of the transformer 220 and the number of coils wound in the transformer 220, a voltage of a second winding wire 223 of the second side may be increased.

The rectifier 240 may output the high voltage, which is in the form of a direct current voltage, by rectifying an alternating current voltage of the second side of the transformer 220. For example, the alternating current voltage of the second side that is output from the second side of the transformer 220 may be output as the high voltage in the form of a direct current voltage by going through a rectification operation and a back pressure operation.

The detector may monitor whether the high voltage power supply apparatus 10 supplies the high voltage to the developing device. The detector may include the signal sensor configured to sense a voltage applied to the comparator 210 and a voltage applied to the transformer 220 and the sensing output portion configured to output, based on a result of the sensing operation of the signal sensor, the operational state information indicating whether the high voltage power supply apparatus 10 operates normally.

For example, the first signal sensing portion 231 may sense a first direct current voltage input to the positive (+) terminal of the OP-amp. Here, the first direct current voltage may be a direct current voltage converted from a first alternating current voltage applied from the input terminal based on a PWM control operation. The first signal sensing portion 231 may include the first transistor.

When an output voltage difference of 0.7V is generated between a base and an emitter of the first transistor as the first direct current voltage is applied to the base of the first transistor, a collector and the emitter of the first transistor may be electrically connected to each other. In this case, currents may flow from the collector of the first transistor to the emitter of the first transistor so that the first transistor may operate.

However, when the first alternating current voltage is not applied from the input terminal based on the PWM control operation, the first transistor may not operate.

As another example, the second signal sensing portion 232 may sense an alternating current voltage of the first winding wire 221 of the first side of the transformer 220. The second signal sensing portion 232 may include the second transistor.

The alternating current voltage of the first winding wire 221 may be converted into the direct current voltage of the first winding wire 221 via a half-wave rectifying circuit. When the output voltage difference of 0.7V is generated between a base and an emitter of the second transistor as the direct current voltage of the first winding wire 221 is applied to the base of the second transistor, a collector and the emitter of the second transistor may be electrically connected to each other. In this case, when the first transistor and the second transistor are connected in series and the first transistor operates, currents may flow from the collector of the second transistor to the emitter of the second transistor, so that the second transistor may operate. However, when the first transistor and the second transistor are connected in series and the first transistor does not operate, the second transistor may not operate.

Meanwhile, the sensing output portion may include the first sensing output portion 233 including at least one light-emitting device and the second sensing output portion 234 configured to transmit the operational state information of the high voltage power supply apparatus 10 to a central processor of an image forming apparatus.

For example, when the first transistor and the second transistor operate normally in a state in which the first transistor and the second transistor are connected in series and the sensing output portion is connected to the collector of the first transistor, the first sensing output portion 233 may output the operational state information indicating that the high voltage power supply apparatus 10 operates normally, by turning on the at least one light-emitting device. The second sensing output portion 234 may transmit the operational state information indicating that the high voltage power supply apparatus 10 operates normally to the central processor of the image forming apparatus. Here, that the transistor operates normally may denote that the collector and the emitter of the transistor are electrically connected to each other so that currents flow from the collector to the emitter of the transistor. The central processor of the image forming apparatus may display the operational state information of the high voltage power supply apparatus 10 through a user interface device of the image forming apparatus.

As another example, when at least one of the first transistor and the second transistor doesn't operate normally in a state in which the first transistor and the second transistor are connected in series and the sensing output portion is connected to the collector of the first transistor, the first sensing output portion 233 may turn off the at least one light-emitting device. Also, the second sensing output portion 234 may transmit the operational state information indicating that the high voltage power supply apparatus 10 does not operate normally to the central processor of the image forming apparatus.

Meanwhile, the high voltage power supply apparatus 10 may include other devices, in addition to the device illustrated in FIG. 3.

Figure 4:
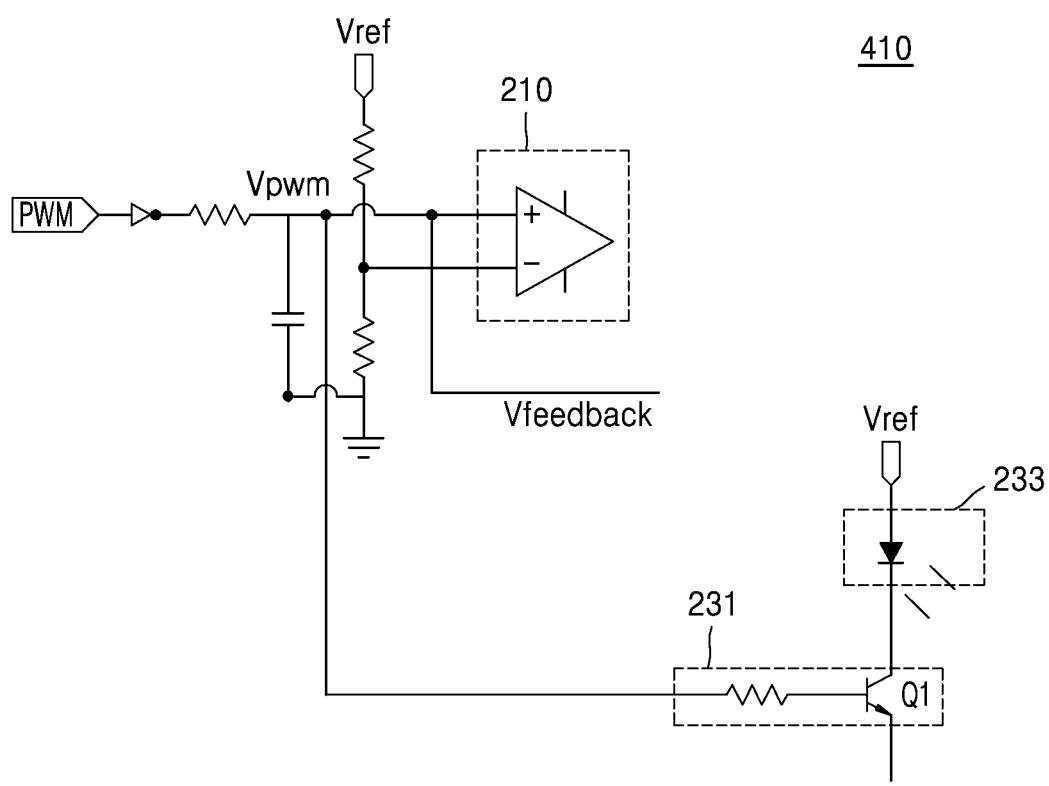
FIG. 4 is a diagram for describing an operation of a first signal sensing portion configured to monitor whether a comparator operates normally in a high voltage power supply apparatus, according to an example.

FIG. 4 is a diagram for describing an operation of a first signal sensing portion configured to monitor whether the comparator 210 operates normally in the high voltage power supply apparatus 10, according to an example.

Referring to a circuit diagram 410 of FIG. 4, the comparator 210 may control an output of a basic voltage on which a high voltage is based, the high voltage being used to perform an image forming job in the image forming apparatus. For example, the comparator 210 may be realized as an OP-amp.

In detail, a first alternating current voltage may be applied to the input terminal and the first alternating current may be converted into an opposite phase via an inverter. The first alternating current voltage converted into the opposite phase may be converted into a first direct current voltage by passing through an LPF. A positive (+) terminal of the OP-amp may receive the first direct current voltage.

For example, when the first alternating current voltage is not applied to the input terminal, the positive (+) terminal of the OP-amp may not receive the first direct current voltage and a feedback voltage fed back from the high voltage. In this case, the high voltage power supply apparatus 10 may not supply the high voltage to the developing device. Thus, the first signal sensing portion 231 in the high voltage power supply apparatus 10 may check whether the high voltage power supply apparatus 10 operates normally by monitoring whether the first direct current voltage is input to the positive (+) terminal of the OP-amp.

The first transistor in the first signal sensing portion 231 may sense the first direct current voltage input to the positive (+) terminal of the OP-amp. When the first direct current voltage is applied to a base of the first transistor and an output voltage difference of 0.7V is generated between the base and an emitter of the first transistor, currents may flow from a collector of the first transistor to the emitter of the first transistor, so that the first transistor may operate normally.

The first sensing output portion 233 may include at least one light-emitting device. When the first transistor operates normally, currents may flow from the collector of the first transistor to the emitter of the first transistor, so that the at least one light-emitting device in the first sensing output portion 233 may be turned on. In this case, a user may identify the state in which the at least one light-emitting device is turned on and identify that the high voltage power supply apparatus 10 operates normally.

Figure 5:
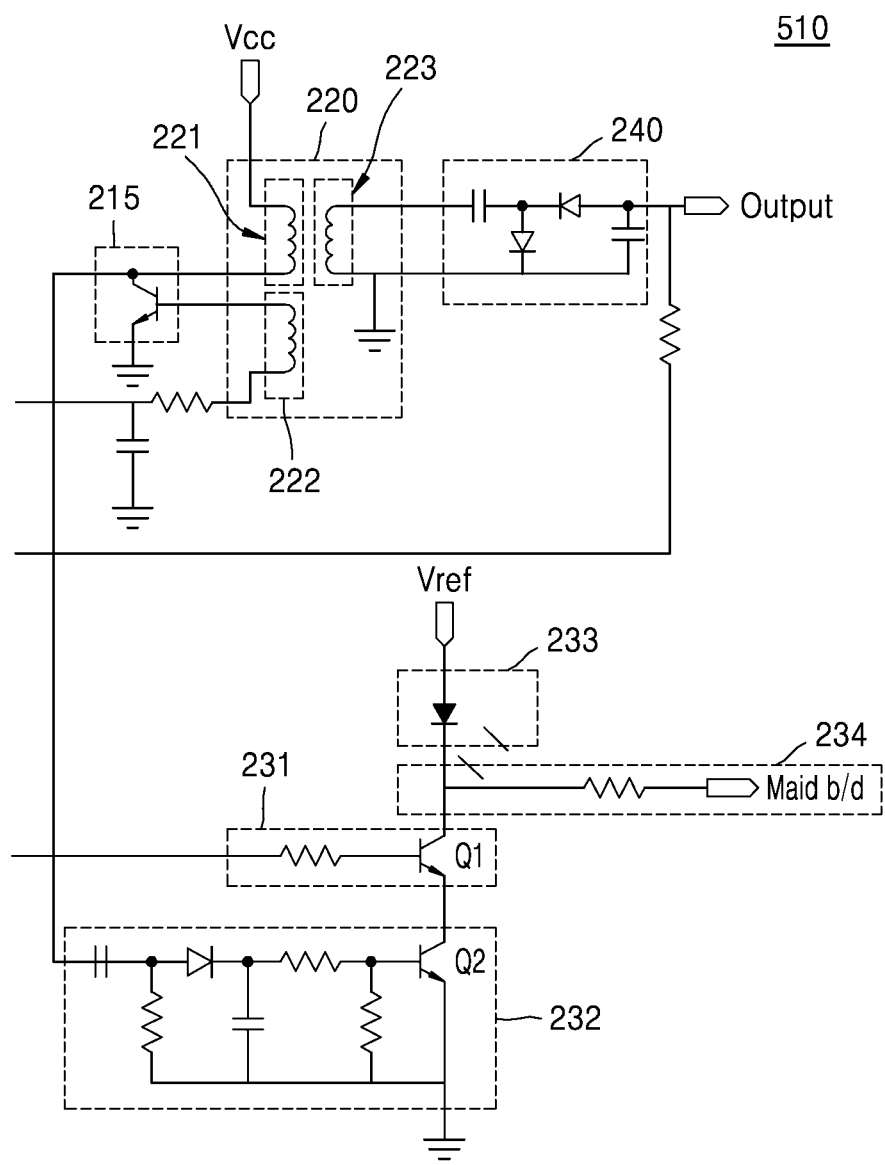
FIG. 5 is a diagram for describing an operation of a second signal sensing portion configured to monitor whether a transformer operates normally in a high voltage power supply apparatus, according to an example.

FIG. 5 is a diagram for describing an operation of the second signal sensing portion 232 configured to monitor whether the transformer 220 operates normally in the high voltage power supply apparatus 10, according to an example.

Referring to a circuit diagram 510 of FIG. 5, the basic voltage output by the OP-amp may control a base current of the third transistor based on an RLC resonance phenomenon. The third transistor included in the switching controller 215 may repeatedly perform a switching operation, whereby the basic voltage is connected to a base of the third transistor by passing through the auxiliary winding wire 222 of the first side of the transformer 220, so that the first winding wire 221 of the first side is connected to a ground.

When the third transistor repeatedly performs the switching operation, there may be a change in a voltage and a current of the first winding wire 221 of the first side of the transformer 220. In accordance with the change in the voltage and the current of the first winding wire 221 of the first side of the transformer 220 and the number of coils wound in the transformer 220, a voltage of the second winding wire 223 of the second side of the transformer 220 may be increased. The rectifier 240 may rectify an alternating current voltage of the second side of the transformer 220 to output the high voltage, which is in the form of a direct current voltage.

An alternating current voltage of the first winding wire 221 may be converted into a direct current voltage of the first winding wire 221 through a half-wave rectifying circuit in the second signal sensing portion 232. When the direct current voltage of the first winding wire 221 is applied to a base of the second transistor and an output voltage difference of 0.7V between the base and an emitter of the second transistor is generated, currents may flow from a collector of the second transistor to the emitter of the second transistor, so that the second transistor may operate normally.

As illustrated in the circuit diagram 510 of FIG. 5, the first transistor in the first signal sensing portion 231 and the second transistor in the second signal sensing portion 232 may be connected in series. When the first transistor and the second transistor operate normally, currents may flow from the collector of the first transistor to the emitter of the first transistor and currents may flow from the collector of the second transistor to the emitter of the second transistor, so that at least one light-emitting device in the first sensing output portion 233 may operate in a turned-on state. Also, the second sensing output portion 234 may transmit operational state information indicating that the high voltage power supply apparatus 10 operates normally to a central processor of the image forming apparatus.

However, when at least one of the first transistor and the second transistor does not operate normally, the at least one light-emitting device in the first sensing output portion 233 may operate in a turned-off state. Also, the second sensing output portion 234 may transmit operational state information indicating that the high voltage power supply apparatus 10 does not operate normally to the central processor of the image forming apparatus.

Figure 6:
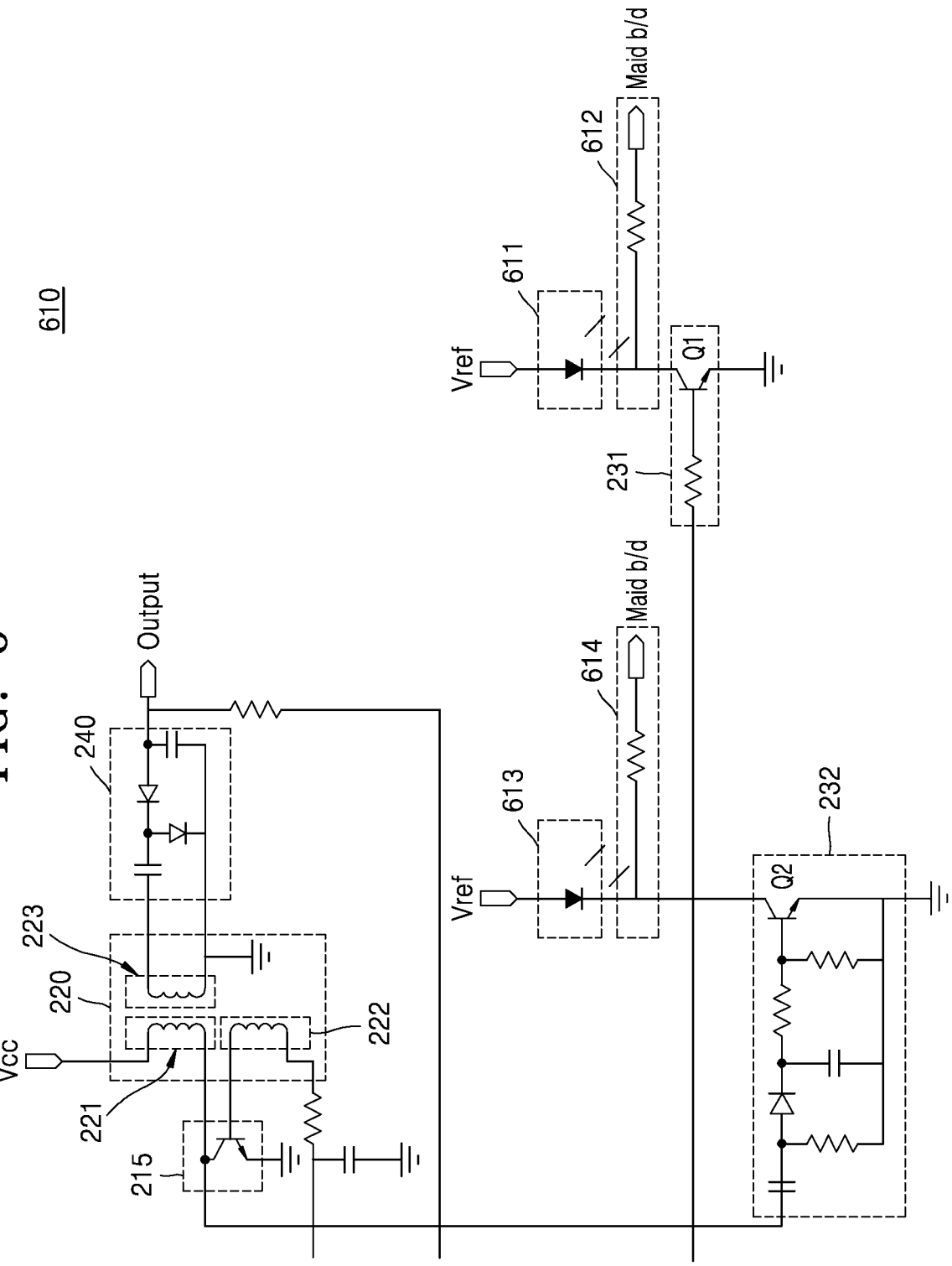
FIG. 6 is a diagram for describing operations of a first signal sensing portion and a second signal sensing portion in a high voltage power supply apparatus, according to another example.

FIG. 6 is a diagram for describing operations of the first signal sensing portion 231 and the second signal sensing portion 232 in the high voltage power supply apparatus 10, according to another example.

In the circuit diagram 510 of FIG. 5, the first transistor in the first signal sensing portion 231 and the second transistor in the second signal sensing portion 232 may be connected in series. However, in a circuit diagram 610 of FIG. 6, the first transistor in the first signal sensing portion 231 and the second transistor in the second signal sensing portion 232 may be connected in parallel. That is, the first signal sensing portion 231 and the second signal sensing portion 232 may be connected in parallel. Also, the collector of the first transistor in the first signal sensing portion 231 may be connected to a first sensing output portion 611 and a second sensing output portion 612 corresponding to the first signal sensing portion 231. Also, the collector of the second transistor in the second signal sensing portion 232 may be connected to a first sensing output portion 613 and a second sensing output portion 614 corresponding to the second signal sensing portion 232.

Operations of the transformer 220, the rectifier 240, and the third transistor of FIG. 6 may correspond to the operations of the transformer 220, the rectifier 240, and the third transistor described with reference to FIG. 5.

With respect to the operation of the first signal sensing portion 231, for example, when the first transistor in the first signal sensing portion 231 operates normally, currents may flow from the collector of the first transistor to the emitter of the first transistor and at least one light-emitting device in the first sensing output portion 611 may operate in a turned-on state. Also, the second sensing output portion 612 may transmit operational state information indicating that the comparator 210 in the high voltage power supply apparatus 10 operates normally to a central processor of the image forming apparatus.

On the contrary, when the first transistor in the first signal sensing portion 231 does not operate normally, the at least one light-emitting device in the first sensing output portion 611 may operate in a turned-off state. Also, the second sensing output portion 612 may transmit operational state information indicating that the comparator 210 in the high voltage power supply apparatus 10 does not operate normally to the central processor of the image forming apparatus.

With respect to the operation of the second signal sensing portion 232, for example, when the second transistor in the second signal sensing portion 232 operates normally, currents may flow from the collector of the second transistor to the emitter of the second transistor and the at least one light-emitting device in the first sensing output portion 613 may operate in a turned-on state. Also, the second sensing output portion 614 may transmit operational state information indicating that the transformer 220 in the high voltage power supply apparatus 10 operates normally to the central processor of the image forming apparatus.

On the contrary, when the second transistor in the second signal sensing portion 232 does not operate normally, the at least one light-emitting device in the first sensing output portion 613 may operate in a turned-off state. Also, the second sensing output portion 614 may transmit operational state information indicating that the transformer 220 in the high voltage power supply apparatus 10 does not operate normally to the central processor of the image forming apparatus.

That is, when the first signal sensing portion 231 and the second signal sensing portion 232 are connected in parallel, the high voltage power supply apparatus 10 may provide the operational state information of each of the comparator 210 and the transformer 220 in the high voltage power supply apparatus 10.

Figure 7:
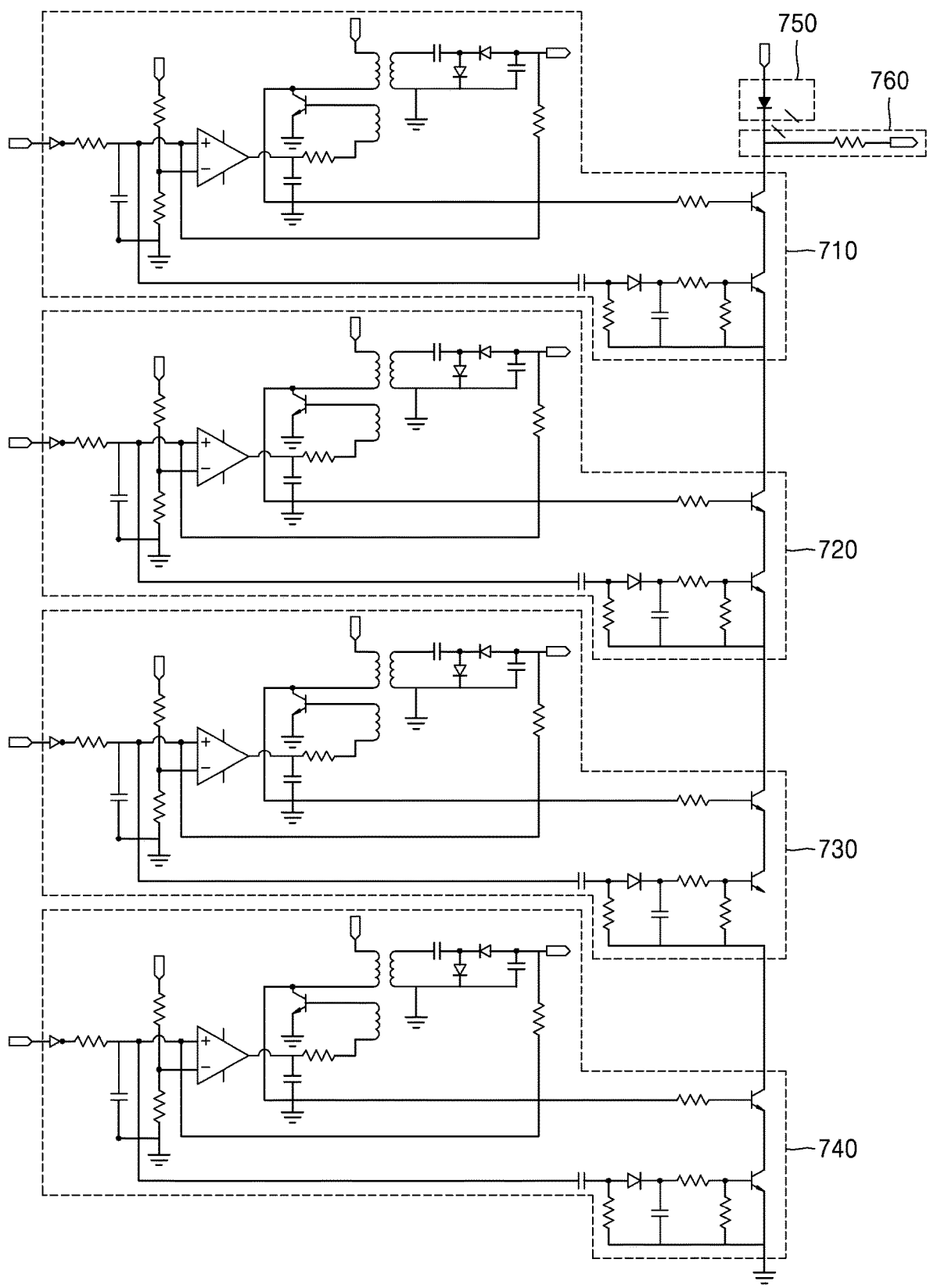
FIG. 7 is a diagram for describing an operation of a signal sensor configured to monitor whether a plurality of high voltage power supply apparatuses operate normally, when a high voltage power supply apparatus includes the plurality of high voltage power supply apparatuses connected to each other, and an operation of a sensing output portion configured to output a result of the monitoring operation, according to an example.

FIG. 7 is a diagram for describing operations of a signal sensing portion configured to monitor whether a plurality of high voltage power supply apparatuses 710, 720, 730, and 740 operate normally, when the high voltage power supply apparatus includes the plurality of high voltage power supply apparatuses connected to each other, and a sensing output portion configured to output a result of the monitoring operation, according to an example.

As illustrated in a circuit diagram of FIG. 7, the plurality of high voltage power supply apparatuses 710, 720, 730, and 740 may be connected in parallel. Each of the plurality of high voltage power supply apparatuses 710, 720, 730, and 740 may include a first signal sensing portion and a second signal sensing portion. Operations of the first signal sensing portion and the second signal sensing portion of each of the plurality of high voltage power supply apparatuses 710, 720, 730, and 740 may correspond to the operations of the first signal sensing portion 231 and the second signal sensing portion 232 described with reference to FIGS. 2 through 6.

As illustrated in a circuit diagram of FIG. 7, the first signal sensing portion and the second signal sensing portion of each of the plurality of high voltage power supply apparatuses 710, 720, 730, and 740 may be connected to one first sensing output portion 750 and one second sensing output portion 760.

For example, when a normal high voltage is not output from an output terminal of at least one of the plurality of high voltage power supply apparatuses 710, 720, 730, and 740, at least one light-emitting device in the first sensing output portion 750 may operate in a turned-off state. Also, the second sensing output portion 760 may transmit operational state information indicating that the at least one high voltage power supply apparatus does not operate normally to a central processor of the image forming apparatus.

As another example, when a normal high voltage is output from an output terminal of the plurality of high voltage power supply apparatuses 710, 720, 730, and 740, at least one light-emitting device in the first sensing output portion 750 may operate in a turned-on state. Also, the second sensing output portion 760 may transmit operational state information indicating that the high voltage power supply apparatus operates normally to the central processor of the image forming apparatus.

Figure 8:
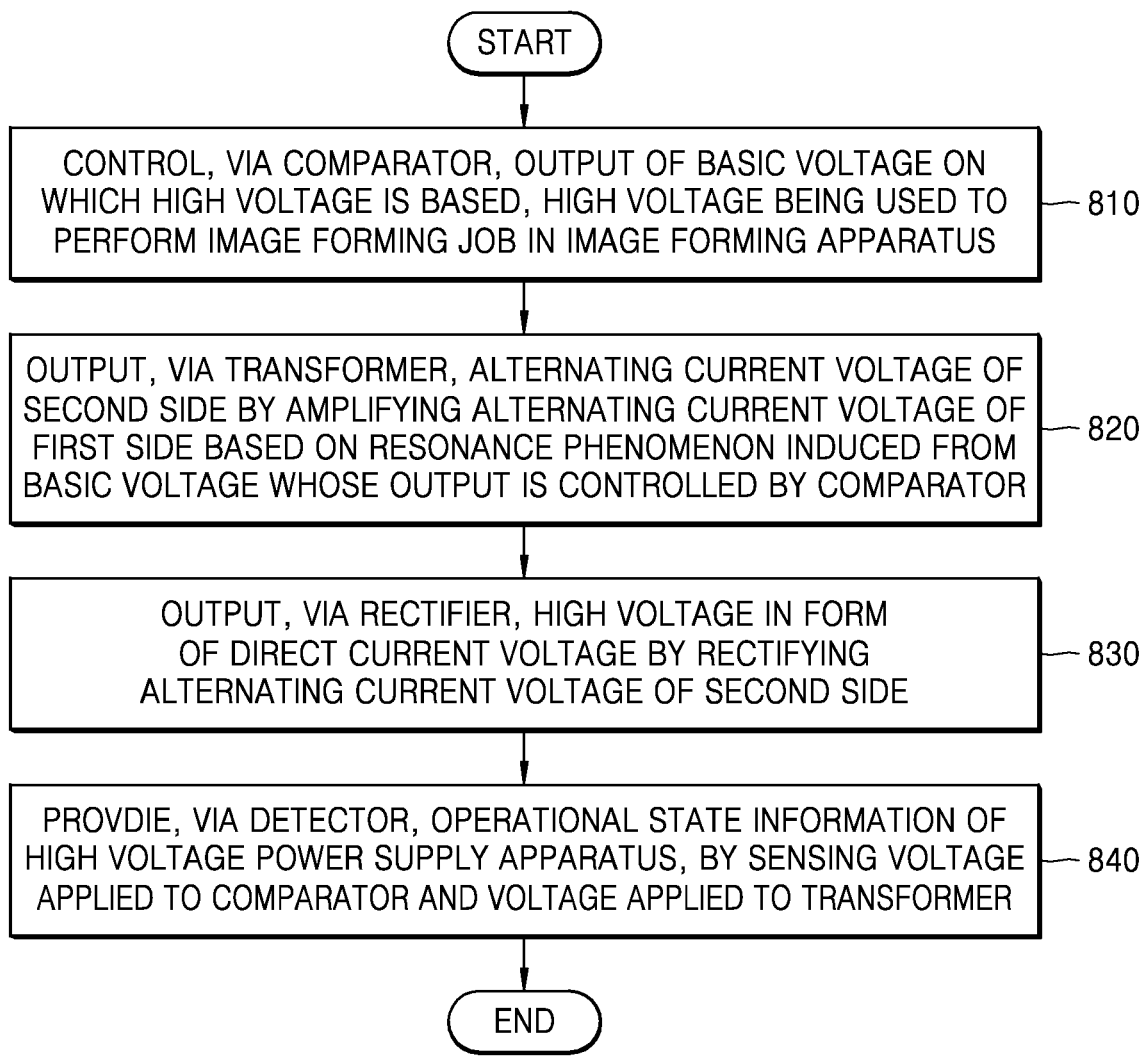
FIG. 8 is a flowchart of an operating method of a high voltage power supply apparatus, according to an example.

FIG. 8 is a flowchart of an operating method of the high voltage power supply apparatus 10, according to an example.

Referring to FIG. 8, in operation S810 of the high voltage power supply apparatus 10, a comparator in the high voltage power supply apparatus 10 may control an output of a basic voltage on which a high voltage is based, the high voltage being used to perform an image forming job in an image forming apparatus.

In operation S820 of the high voltage power supply apparatus 10, a transformer in the high voltage power supply apparatus 10 may output an alternating current voltage of a second side by amplifying an alternating current voltage of a first side, based on a resonance phenomenon induced from the basic voltage output from the comparator.

In operation S830 of the high voltage power supply apparatus 10, a rectifier in the high voltage power supply apparatus 10 may output a high voltage in the form of a direct current voltage by rectifying the alternating current voltage of the second side.

In operation S840 of the high voltage power supply apparatus 10, a detector in the high voltage power supply apparatus 10 may provide operational state information of the high voltage power supply apparatus 10, by sensing a voltage applied to the comparator and a voltage applied to the transformer.

For example, the detector may sense a first direct current voltage input to a positive (+) terminal of the comparator from an input terminal based on a PWM control operation. Also, the detector may sense an alternating current voltage of a first winding wire of the first side of the transformer. The detector may output, based on a result of sensing the first direct current voltage and a result of sensing the alternating current voltage of the first winding wire, the operational state information indicating whether the high voltage power supply apparatus 10 operates normally.

The high voltage power supply apparatus 10 of FIG. 8 may perform the operation of the high voltage power supply apparatus 10 described with reference to FIGS. 1 through 7. In FIG. 8, descriptions that are the same as the descriptions with reference to FIGS. 1 through 7 are omitted.

Figure 9:
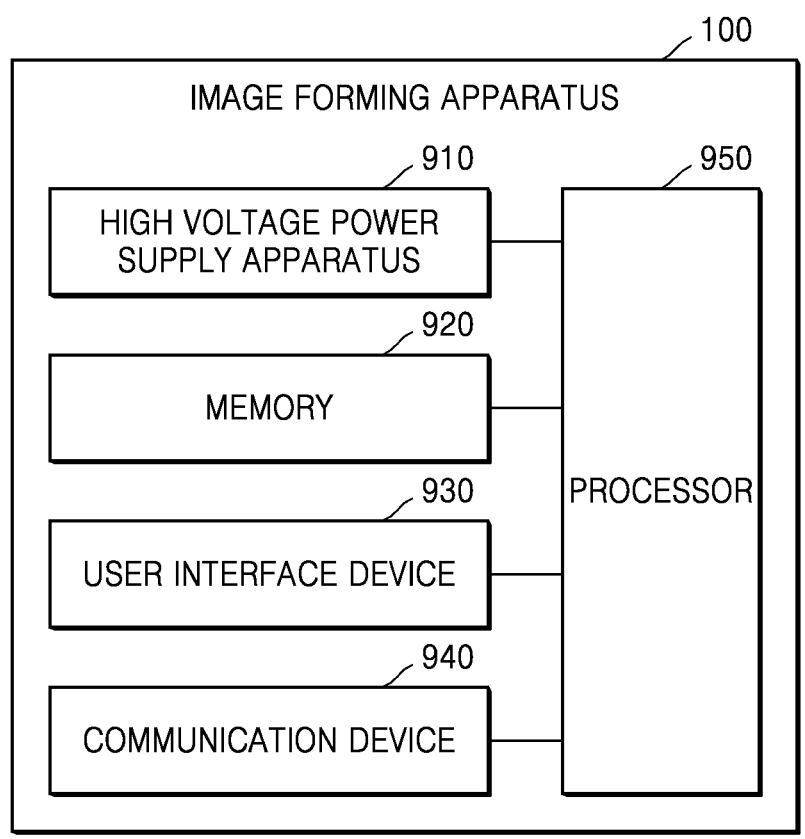
FIG. 9 is a block diagram of components of an image forming apparatus including a high voltage power supply apparatus, according to an example.

FIG. 9 is a block diagram of components of an image forming apparatus 100 including a high voltage power supply apparatus 910, according to an example.

Referring to FIG. 9, the image forming apparatus 100 may include the high voltage power supply apparatus 910, a memory 920, a user interface device 930, a communication device 940, and a processor 950. The image forming apparatus 100 may be realized by including more or less components than the illustrated components. Hereinafter, the components described above will be described.

The high voltage power supply apparatus 910 may generate a high voltage used to perform an image forming job in the image forming apparatus 100. The high voltage power supply apparatus 910 may supply the high voltage to a developing device in the image forming apparatus 100. The high voltage power supply apparatus 910 of FIG. 9 may be the same as the high voltage power supply apparatus 10 described with reference to FIGS. 1 through 8. In FIG. 9, descriptions that are the same as the descriptions with reference to FIGS. 1 through 8 are omitted.

The memory 920 may store programs, data, or files related to the image forming apparatus 100. For example, the memory 920 may store programs, data, or files related to a method of monitoring whether the high voltage power supply apparatus 910 normally supplies the high voltage to the developing device. The processor 950 may execute the programs stored in the memory 920, read the data or files stored in the memory 920, or store new files in the memory 920. The memory 920 may store program commands, data files, data structures, etc. singularly or by combining the same. The memory 920 may store instructions executable by the processor 950.

The user interface device 930 may include an input portion configured to receive an input, etc., for performing an image forming job from a user, and an output portion configured to display information, such as a result of performing the image forming job or a state of the image forming apparatus 100. For example, the user interface device 930 may include a manipulation panel for receiving a user input, a display panel for displaying a screen, etc.

In detail, the input portion may include devices for receiving user inputs of various forms, such as a keyboard, a physical button, a touch screen, a camera, or a microphone. Also, the output portion may include, for example, a display panel or a speaker. However, the user interface device 930 is not limited thereto, and may include devices supporting various inputs and outputs.

For example, the user interface device 930 may display operational state information of the high voltage power supply apparatus 910, based on a result of monitoring whether the high voltage power supply apparatus 910 normally supplies the high voltage to the developing device.

The communication device 940 may perform communication with an external apparatus. In detail, the communication device 940 may perform communication with an external apparatus by being connected to a network with wires or wirelessly. Here, the external apparatus may include a server, a smartphone, a tablet personal computer (PC), a PC, home appliances, medical equipment, a camera, a wearable device, etc., but is not limited thereto.

The communication device 940 may include a communication module supporting one of various wired or wireless communication methods. For example, the communication module may have the form of a chipset or may have the form of a sticker/barcode (e.g., a sticker including a near field communication (NFC) tag) including information needed for communication. Also, the communication module may include a NFC module and a wired communication module, but is not limited thereto.

The communication device 940 may support, for example, at least one of a wireless local area network (LAN), wireless fidelity (Wi-Fi), Wi-Fi direct, Bluetooth, universal serial bus (USB), a wired LAN, and NFC.

The processor 950 may control general operations of the image forming apparatus 100 and may include at least one processor, such as a central processing unit (CPU). The processor 950 may control other components included in the image forming apparatus 100 to perform operations corresponding to user inputs received via the user interface device 930. The processor 950 may include at least one specialized processor corresponding to each of functions or may be an integrated type processor.

Based on the instructions stored in the memory 920, the processor 950 may control an operation of the high voltage power supply apparatus 910 to monitor whether the high voltage power supply apparatus 910 normally supplies the high voltage to the developing device in the image forming apparatus 100. An operation of the high voltage power supply apparatus 910 of FIG. 9 may be the same as the operation of the high voltage power supply apparatus 10 described with reference to FIGS. 1 through 8. In FIG. 9, descriptions that are the same as the descriptions with reference to FIGS. 1 through 9 are omitted.

Figure 10:
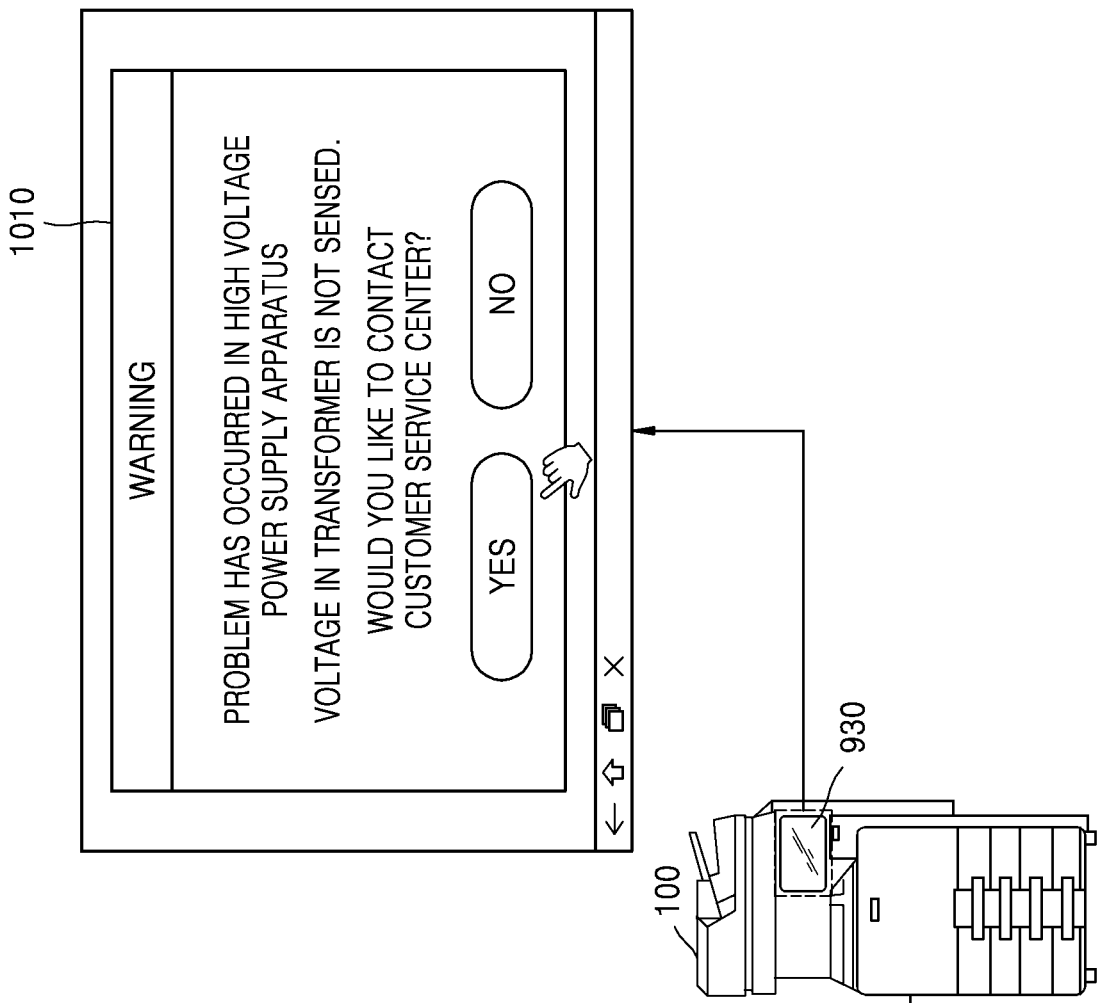
FIG. 10 is a diagram for describing an operation of an image forming apparatus configured to control an operation of a high voltage power supply apparatus and display operational state information of the high voltage power supply apparatus and guide information, according to an example.

FIG. 10 is a diagram for describing an operation of the image forming apparatus 100 configured to control an operation of the high voltage power supply apparatus 910 and display operational state information of the high voltage power supply apparatus 910 and guide information, according to an example.

The image forming apparatus 100 may control the operation of the high voltage power supply apparatus 910 to monitor whether the high voltage powers supply apparatus 910 normally supplies the high voltage to the developing device in the image forming apparatus 100.

The high voltage power supply apparatus 910 may sense a voltage applied to a comparator and a voltage applied to a transformer in the high voltage power supply apparatus 910 and may detect defects of the high voltage power supply apparatus 910 based on a result of the sensing operation. An operation of the high voltage power supply apparatus 910 of FIG. 10 is the same as the operation of the high voltage power supply apparatus 10 described with reference to FIGS. 1 through 8. In FIG. 10, descriptions that are the same as the descriptions with reference to FIGS. 1 through 8 are omitted.

For example, when the high voltage power supply apparatus 910 operates normally, the image forming apparatus 100 may output a light-emitting device in the image forming apparatus 100 as a green color.

As another example, when the high voltage power supply apparatus 910 does not operate normally, the image forming apparatus 100 may output the light-emitting device in the image forming apparatus 100 as a red color. Also, the image forming apparatus 100 may display, via the user interface device 930, operational state information indicating that the high voltage power supply apparatus 910 does not operate normally. For example, the image forming apparatus 100 may, via the user interface device 930, display a message 1010 indicating the operational state information of the high voltage power supply apparatus 910, such as "a problem has occurred in the high voltage power supply apparatus 910. A voltage in the transformer is not sensed." Also, the image forming apparatus 100 may display, via the user interface device 930, the guide information with respect to an operational state of the high voltage power supply apparatus 910. For example, to solve the problem with respect to the voltage in the transformer, the image forming apparatus 100 may display, via the user interface device 930, the message 1010 including the guide information, such as "would you like to contact the customer service center?"

Meanwhile, the operating methods of the image forming apparatus 100 and the high voltage power supply apparatuses 10 and 910 described above may be implemented as a computer-readable storage medium that stores instructions or data executable by a computer or a processor. The operating methods of the image forming apparatus 100 and the high voltage power supply apparatuses 10 and 910 described above may be implemented by a general-purpose digital computer capable of writing programs executable by a computer and operating the programs by using a computer-readable storage medium. The computer readable storage medium may include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, a magnetic tape, a floppy disk, a magneto-optical data storage device, an optical data storage device, a hard disk, a solid state disk (SSD), and any other devices capable of storing instructions or machine readable instructions, related data, data files, and data structures and providing the instructions or machine readable instructions, related data, data files, and data structures to a processor or a computer to be executed by the processor or the computer.

The present disclosure has been described above according to the limited examples and the drawings. However, various modifications and alternations may be made by one of ordinary skill in the art. For example, the technologies described above may be executed in different orders from the methods described above, and/or appropriate results may be achieved when the described components, such as the systems, structures, devices, circuits, etc., are integrated or combined in different forms from the methods described above or when different components or equivalents replace or substitute the described components, such as the systems, structures, devices, circuits, etc.

Therefore, the scope of the present disclosure should not be construed by being limited to the described examples, and should be defined by the following claims with equivalents of the claims.

What is claimed is:

1. A high voltage power supply apparatus including:
   a comparator to control output of a basic voltage, a high voltage based on the basic voltage is used to perform an image forming job in an image forming apparatus;
   a transformer to output an alternating current voltage of a second side of the transformer by amplifying an alternating current voltage of a first side of the transformer, the amplifying being based on a resonance phenomenon induced from the basic voltage;
   a rectifier to output the high voltage by rectifying the alternating current voltage of the second side, the high voltage output from the rectifier being a direct current voltage; and
   a detector to sense a voltage applied to the comparator and a voltage applied to the transformer, and to output operational state information of the high voltage power supply apparatus based on the sensed voltages.

2. The high voltage power supply apparatus of claim 1, wherein a positive (+) terminal of the comparator is to receive a first direct current voltage converted, based on a pulse width modulation (PWM) control operation, from a first alternating current voltage applied from an input terminal, and is to receive a feedback voltage fed back from the high voltage, and
   a negative (−) terminal of the comparator is to receive a reference voltage, and
   the comparator is further to output the basic voltage based on a difference between a combined voltage of the first direct voltage and the feedback voltage input to the positive (+) terminal and the reference voltage input to the negative (−) terminal.

3. The high voltage power supply apparatus of claim 1, wherein the detector includes:
a signal sensor to sense the voltage applied to the comparator and sense an alternating current voltage of a first winding wire of the first side of the transformer; and
a sensing output portion to output, based on the sensing by the signal sensor, the operational state information, the operational state information indicates whether the high voltage power supply apparatus operates normally.

4. The high voltage power supply apparatus of claim 3, wherein the signal sensor includes:
a first signal sensing portion to sense a first direct current voltage input to a positive (+) terminal of the comparator from an input terminal, the first direct current voltage being converted, based on a pulse width modulation (PWM) control operation, from a first alternating current voltage applied from the input terminal; and
a second signal sensing portion to sense the alternating current voltage of the first winding wire of the first side of the transformer.

5. The high voltage power supply apparatus of claim 4, wherein the first signal sensing portion includes a first transistor, the first transistor to operate when the first direct current voltage is applied to a base of the first transistor, and
the second signal sensing portion includes a second transistor, the second transistor to operate when a direct current voltage of the first winding wire is applied to a base of the second transistor, the direct current voltage of the first winding wire being converted from the alternating current voltage of the first winding wire via a half-wave rectifying circuit.

6. The high voltage power supply apparatus of claim 5, wherein the sensing output portion includes a first sensing output portion including at least one light-emitting device, and
when the first transistor and the second transistor operate normally in a state in which the first transistor and the second transistor are connected in series with each other and the sensing output portion is connected to a collector of the first transistor, the first sensing output portion is to output, via the at least one light-emitting device, a signal notifying that the high voltage power supply apparatus operates normally.

7. The high voltage power supply apparatus of claim 5, wherein the sensing output portion includes a second sensing output portion to transmit the operational state information of the high voltage power supply apparatus to a central processor of the image forming apparatus, and
when the first transistor and the second transistor operate normally in a state in which the first transistor and the second transistor are connected in series with each other and the sensing output portion is connected to a collector of the first transistor, the second sensing output portion is to transmit a signal notifying that the high voltage power supply apparatus operates normally to the central processor of the image forming apparatus.

8. The high voltage power supply apparatus of claim 1, further including a third transistor to perform a switching control operation based on a resistor, an inductor, and a capacitor (RLC) resonance phenomenon induced from the basic voltage to induce a change in a voltage and a current of a first winding wire of the first side of the transformer.

9. The high voltage power supply apparatus of claim 8, wherein the third transistor is to perform a switching operation to connect the basic voltage i to a base of the third transistor by passing through an auxiliary winding wire of the first side of the transformer so the first winding wire of the first side is connected to a ground.

10. The high voltage power supply apparatus of claim 1, further including an output terminal to supply the high voltage to a developing device in the image forming apparatus.

11. An operating method of a high voltage power supply apparatus, the operating method including:
controlling, via a comparator, output of a basic voltage, a high voltage based on the basic voltage is used to perform an image forming job in an image forming apparatus;
outputting, via a transformer, an alternating current voltage of a second side of the transformer by amplifying an alternating current voltage of a first side of the transformer, the amplifying being based on a resonance phenomenon induced from the basic voltage;
outputting, via a rectifier, the high voltage by rectifying the alternating current voltage of the second side, the high voltage output from the rectifier being a direct current voltage;
sensing, via a detector, a voltage applied to the comparator and a voltage applied to the transformer; and
outputting, via the detector, operational state information of the high voltage power supply apparatus based on the sensed voltages.

12. The operating method of claim 11, wherein the providing, via the detector, of the operation state information of the high voltage power supply apparatus includes:
sensing a first direct current voltage that is input to a positive (+) terminal of the comparator from an input terminal, the first direct current voltage being converted, based on a pulse width modulation (PWM) control operation, from a first alternating current voltage applied from the input terminal;
sensing the alternating current voltage of the first winding wire of the first side of the transformer; and
outputting, based on the sensing of the first direct current voltage and the sensing of the alternating current voltage of the first winding wire, the operational state information indicating whether the high voltage power supply apparatus operates normally.

13. An image forming apparatus including:
a high voltage power supply apparatus;
a memory; and
a processor to control operations of the high voltage power supply apparatus such that, whether supply by the high voltage power supply apparatus of a high voltage to a developing device in the image forming apparatus is performed normally is monitored, based on instructions stored in the memory,
wherein the high voltage power supply apparatus includes:
a comparator to control output of a basic voltage, a high voltage based on the basic voltage is used to perform an image forming job in the image forming apparatus;
a transformer to output an alternating current voltage of a second side of the transformer by amplifying an alternating current voltage of a first side of the transformer, the amplifying being based on a resonance phenomenon induced from the basic voltage;

a rectifier to output the high voltage by rectifying the alternating current voltage of the second side, the high voltage output from the rectifier being a direct current voltage; and a detector to sense a voltage applied to the comparator and a voltage applied to the transformer, and to output operational state information of the high voltage power supply apparatus based on the sensed voltages.

14. The image forming apparatus of claim 13, wherein the detector includes:

a first signal sensing portion to sense a first direct current voltage input to a positive (+) terminal of the comparator from an input terminal, the first direct current voltage being converted, based on a pulse width modulation (PWM) control operation, from a first alternating current voltage applied from the input terminal;

a second signal sensing portion connected in series with the first signal sensing portion and to sense the alternating current voltage of the first winding wire of the first side of the transformer; and a sensing output portion to output, based on the sensing by the first signal sensing portion and the second signal sensing portion, the operational state information indicating whether the high voltage power supply apparatus operates normally.

15. The image forming apparatus of claim 14, wherein the sensing output portion includes at least one light-emitting device, and when the first signal sensing portion and the second signal sensing portion operate normally, the sensing output portion is to output, via the at least one light-emitting device, a signal notifying that the high voltage power supply apparatus operates normally.

* * * * *